United States Patent [19]

Heller et al.

[11] Patent Number: 4,885,225

[45] Date of Patent: Dec. 5, 1989

[54] COLOR PROOF WITH NON-BLOCKING THERMAL ADHESIVE LAYER WITH PARTICULATE POLYMER BEADS

[75] Inventors: Michael B. Heller, Inver Grove Heights; Leonard W. Sachi, Oakdale; David R. Walbridge, White Bear Lake, all of Minn.

[73] Assignee: Minnesota Mining and Manufacturing Company, St. Paul, Minn.

[21] Appl. No.: 187,829

[22] Filed: Apr. 29, 1988

[51] Int. Cl.$^4$ .......................... G03C 1/60; G03C 7/00
[52] U.S. Cl. .................................... 430/160; 430/143; 430/158; 430/162; 430/175; 430/293; 430/950; 430/961
[58] Field of Search ............... 430/162, 175, 143, 950, 430/158, 160, 961, 293

[56] References Cited

U.S. PATENT DOCUMENTS

| | | | |
|---|---|---|---|
| 3,531,316 | 9/1970 | Sternasty | 117/76 |
| 4,168,979 | 9/1979 | Okishi et al. | 430/950 |
| 4,221,862 | 9/1980 | Naito et al. | 430/536 |
| 4,336,319 | 6/1982 | Nagashima et al. | 430/950 |
| 4,522,967 | 6/1985 | Sheldon et al. | 524/377 |
| 4,560,636 | 12/1985 | Stahlhofen | 430/165 |
| 4,599,299 | 7/1986 | Neiss et al. | 430/326 |
| 4,656,114 | 4/1987 | Cederberg et al. | 430/160 |
| 4,719,169 | 1/1988 | Platzer et al. | 430/258 |

OTHER PUBLICATIONS

Skeist, I. Editor, *Handbook of Adhesives*, 2nd Ed., Van Nostrand Reinhold Co., 1984.
"Cab-O-Sil Fumed Silica Properties and Functions", Cabot Corporation, pp. 15 and 32.
"The Family of SYLOID ® Silicas", Davison Chemical Division of Grace.

*Primary Examiner*—Charles L. Bowers, Jr.
*Attorney, Agent, or Firm*—Donald M. Sell; Walter N. Kirn; Mark A. Litman

[57] ABSTRACT

Particulate organic polymeric beads in the thermal adhesive layer of prepress color proofing elements prevents adhesive blocking without optical interference or reduction in adhesive performance.

18 Claims, No Drawings

COLOR PROOF WITH NON-BLOCKING THERMAL ADHESIVE LAYER WITH PARTICULATE POLYMER BEADS

FIELD OF THE INVENTION

This invention relates to negative acting surprint color proofing systems, and in particular, to laminable proofs which use thermal adhesives in the assembly of the individual color separations to form a single sheet proof.

BACKGROUND OF THE INVENTION

In printing pictorial matter, whether by lithography, letterpress or gravure, the half-tone process is used, wherein the actual printing image is composed of thousands of minute dots per square inch of a single color ink of varied dot size or ink density. What the naked eye sees as shading in half-tone prints is actually controlled variation in the size of dots relative to the unprinted areas between dots. In black and white pictorial matter the dots are printed in black ink only. Full color reproductions, however, are necessarily printed in each of at least three colors, cyan, magenta, and yellow (known as "three color process"), or in these same colors with the addition of black ("four color process"). For each color a separate printing plate is made. In order to make the three or four printing plates, the original color picture or photograph is "separated" photographically, with the use of filters, masks, etc., into a set of three or four half-tone negatives, each representing one of the colors, and containing, dot for dot, the amount of that color which must be printed to produce the desired total color print. The preparation of the color-separation negative is an art and requires considerable skill in handling of the many variables to produce a desired result. Often trial and error is involved requiring correction or replacement of one or more of the negatives. Unless some reliable system is available to "proof" the negatives, the printing press must be set up and copy printed just to secure preliminary proofs. This is time consuming and expensive. It is therefore desirable to provide accurate means for proofing the negatives without printing.

One system for proofing color separation negatives is disclosed in U.S. Pat. No. 3,136,637. A light-sensitive transparent sheet is provided for each of the colors to be printed. Each of the sheets is exposed through its respective color separation negative. Upon processing, the color in the non-image areas is removed, yielding a sheet which contains the desired color pattern in the image areas, while being colorless and transparent in the non-image areas (e.g. between the halftone dots). After each of the separate sheets is made, they are assembled together in registry on a white background, whereupon a color proof results.

That system of color proofing has a number of inherent drawbacks. For example, the laying up of the multiplicity of sheets requires that the viewer look through a plurality (three or four) of transparent films during the proofing operation. Since the composite is made of several separate sheets, extreme care is required to maintain registry. If the individual sheets are not perfectly colorless and transparent in the optical sense, any "haze" or imperfection present is multiplied in the several sheets. Additionally, incident light reflects from the several sheets imparting a gloss which is not truly representative of printed copy, thus introducing a need for interpretation in evaluating the proof.

U.S. Pat. No. 3,671,236 improves upon the proofing system described in U.S. Pat. No. 3,136,637. Photomechanically produced images corresponding with each color are integrally built up on a single substrate (much as occurs in the actual printing operation itself) without any printing operations. The multiplicity of carrier films is eliminated by transferring individual color images from a sheet comprised of (1) a carrier with release surface, (2) pigment and binder layer, (3) photohardenable or insolubilizable layer, (4) barrier layer and (5) pressure-sensitive adhesive layer.

Further improvement over U.S. Pat. No. 3,371,236 is made in U.S. Pat. No. 4,656,114 by the replacement of the pressure-sensitive adhesive layer by a thermally laminable adhesive layer. A thermally adhesive layer can be positioned (before lamination) without a chance of altering the receptor surface or picking up extraneous matter which can occur with pressure-sensitive layers. The physical nature of the smooth, transparent and optically clear thermal adhesive layer offers better optical qualities than the less physically smooth pressure-sensitive adhesive layer.

Blocking is the undesirable adhesion between touching layers such as that which occurs under moderate pressure or during storage. There is often impairment of the adhesive or the contacted surface when an attempt is made to separate members that have bonded. It has been conventional practice to add antiblocking agents to adhesive layers, and in some instances to the opposed surfaces. Typical antiblocking agents include particulates (especially silica), and soluble organic materials that dissolve in the adhesive. silicas can cause significant haze and the soluble antiblocking agents often do not coat out well in certain adhesives and can solubilize important ingredients in adjacent layers. This last problem is particularly damaging in imageable layers with critical sensitometric and color balance problems such as prepress color proofing elements.

The use of silica particles as antiblocking agents is well known. The use of silica particles is well known. Cab-o-sil TM fumed silica is suggested by Cabot Corp. in their product use literature for inclusion in all types of adhesives (water, solvent and heat). When the coatings are activated good adhesive properties result. Nominal particle diameters are less than 0.1 micron (0.01 to 0.07). W. R. Grace, in their description of Syloid TM silicas suggest silicas for elimination of blocking and indicate that controlled particulate size distribution lowers concentrations required for antiblocking. Particle sizes average from 2.5 to 15 microns.

U.S. Pat. No. 2,77,247 shows that preferred polyethylene antiblocking agents have molecular weights not lower than 4000 or greater than 10,000, are used in quantities varying between 2 and 10% by weight (preferred 4 to 8) dissolved in adhesive layer.

Dusting with plasticizer to produce a non-tacky film in U.S. Pat. No. 2,678,284 provides a method of quickly and easily producing a nontacky film of thermoplastic adhesive. The chilled adhesive coated film is dusted with Santizer 3 in the form of a finely divided powder with particles less than about 10 microns.

"Hot-Melt Adhesives" by M. McDonald, Noyes Data Corp. 1971 states that "considerable difficulty has been experienced with coated hot-melt adhesives because of the tendency to adhere or "block" during warm, humid weather. (discusses U.S. Pat. No. 2,772,247 above).

U.S. Pat. No. 3,343,978 describes a non-tacky layer used as a heat-activated adhesive. A typical adhesive (e.g., Example 3) comprises polyethylene, polyterpene resin, and a wax antiblocking agent. This shows the use of a continuous phase (dissolved) antiblocking agent.

U.S. Pat. No. 4,719,169 shows the application of an anti-blocking layer on a proofing system. It is not a particulate layer and may be coated over an adhesive layer, on the back side of the system, or under the adhesive layer (in a transfer system).

U.S. Pat. No. 4,221,862 describes a method for producing finely divided poly(methylmethacrylate) (PMMA) particles. These PMMA beads may be in an aqueous dispersion and have a fairly narrow size distribution.

U.S. Pat. No. 4,522,967 describes a heat-sealable water dispersible adhesive comprising an antiblocking agent at a 5 to 35% by weight level in the adhesive. The anti-blocking agents are selected from polyalkylene glycol materials.

U.S. Pat. No. 3,531,316 uses a powdered insoluble polymer in a thermoplastic layer overcoating a solvent activated adhesive layer. The powdered polymer prevents blocking by said adhesive layer. The antiblocking layer comprises a thermoplastic film forming resin and 50 to 80% by weight of the insoluble polymer powder. A solvent is used to activate the undercoated adhesive layer.

BRIEF DESCRIPTION OF THE INVENTION

The present invention relates to photosensitive articles particularly useful in the generation of photomechanical proofs which comprise a carrier with a release surface, a pigment and binder layer, a photohardenable layer, and organic polymeric solvent soluble barrier layer, and a thermally laminable adhesive layer containing an anti-blocking agent.

DETAILED DESCRIPTION OF THE INVENTION

Excessive laminating temperatures deteriorate the sensitometric properties of the photohardenable layer. The adhesive layer must be thermally laminable at a temperature between 100° and 150° C. at a pressure of 1.6 lb/sq. in. (0.11 kg/sq.cm) preferably at 4.1 lb/in$^2$ (0.29 kg/sq.cm) and must be non-tacky at room temperature or preferably not laminable to paper or shelf-laminable at 45° C., 2 g/sq.cm pressure for at least one week. Even when these conditions are met, shipping and storage temperatures and durations occasionally exceed the above specifications and blocking occurs.

Blocking is a condition where separate sheets of material have become fused together to the point where the act of separating the sheets results in damage to any portion of the sheet. Factors contributing to blocking are temperature, pressure, and time for a specific thermal adhesive. Using a thermal adhesive which required either higher temperatures or higher pressures deteriorate image quality. It is therefore advantageous to use as low a temperature and pressure as possible and still avoid the effect of blocking which occurs at high ambient temperatures.

It has been found that certain materials can be added to thermal adhesives which do not adversely affect color, haze, transparency, or other properties critical to preparing accurate proofs and yet allow the lamination at low temperatures and pressures while avoiding blocking.

The construction according to the present invention would typically comprise a carrier sheet provided with a release surface, which may either be a smooth surface of the carrier itself, or a surface coating thereon. Overlying the surface and in intimate clinging engagement therewith, but not adhesively bonded thereto, is a color coating comprising, for example, a pigmented organophilic water-insoluble solvent-softenable resinous polymer. Coated over and in contact with the color-coating is a light-sensitive diazo resin layer. The color coating and light-sensitive layer are intimately associated and adherently bonded together (and in certain constructions can actually be combined to a single layer). The light-sensitive layer is soluble in a solution which softens and/or partially dissolves the color coating.

Overlying the light-sensitive layer is a continuous developer-resistant resinous protective film or barrier layer. To the exposed surface of the barrier layer is applied a layer of thermally laminable adhesive containing polymer beads. The preferred adhesive layer thickness is from $0.1 \times 10^{-4}$ cm or $1.0 \times 10^{-4}$ cm to $20 \times 10^{-4}$ cm. and the polymer bead mean diameters vary from 1.1 times the specific layer thickness to 3.0 times the specific layer thickness (preferably 1.3 to 2.3) at a weight percent of the thermal adhesive of 0.05 to 2%. The thickness of the layer is measured at the flat areas between peaks formed by the particulates.

In applying that structure to a substrate, such as white paper, the protective liner (if any) first stripped from the adhesive surface and the entire structure is laminated for example, by heated rolling, onto the substrate. Thereafter, the carrier sheet is stripped from the structure, the bond to the paper and the adhesion between the several layers being greater than the non-adhesive clinging engagement between the carrier sheet and the color coating or the release layer. Following the removal of the carrier, the remaining structure, now bonded to the substrate, is exposed to ultraviolet light through the appropriate color separation negative corresponding with the color of the particular coating. In the light struck areas, the ultraviolet light passes through the color coating (which is transparent thereto) and exposes and insolubilizes the light-sensitive material. A firm bond between the light reacted material and the under- and over-lapping coatings occurs. Adjacent unexposed areas remain light-sensitive.

Thereafter the sheet is processed with processing solvent selected with respect to the particular material of which the color coating layer is composed (and which contains a solvent for the unexposed diazo), to develop the image. The color coating and the sensitizer in the non-light struck areas is removed, leaving the color image anchored to the underlying barrier layer by the light-reacted diazo in exposed areas. During processing, the barrier layer serves as a barrier which protects the substrate (and adhesive) from solutions used during the processing.

The adhesive system of the present invention has been found to be limited to a narrow class of available thermal adhesives. Only acrylate polymer (including methacrylate) and copolymer thermal adhesives with a lamination temperature of 100° to 150° C. at a pressure of 0.29 kg/sq. cm for 5-10 seconds have been found to fulfill all requirements of the present invention. Polymers of n-butyl acrylate, ethyl acrylate, isopropyl acrylate and their copolymers with ethylenically unsaturated monomers such as other acrylates or methacrylates, acrylic anhydride, acrylic acid, methacrylic acid, styrene vinyl acetate, and the like are the only types of adhesives that fulfill all essential requirements of the present invention. Monomers which cause yellowing or discoloring of the final adhesive composition when a sheet (e.g., 15,000 sq. cm) is exposed to a source of 5 kw ultraviolet radiation having a peak at about 417 nm at 1 meter for two minutes must be avoided. Any change in the optical density of 0.1 and even 0.05 is considered intolerable discoloration. Copolymerizable ethylenically unsaturated materials such as acrylonitrile, vinylidene chloride, and vinyl chloride tend to cause yellowing and must be used, if used at all in amount less than 10% and preferably less that 5% of the total dry weight of components in the adhesive. Preferred compositions include poly(n-butyl acrylate/ethyl acrylate) (60/40), poly(ethyl acrylate/styrene)(64/36), poly(n-butylacrylate), poly(stryene/n-butylacrylate/acrylic acid/acrylonitrile)(45/45/8/2), and poly(n-butyl acrylate/vinyl acetate)(80/20). Vinyl acetate and acrylic monomer copolymers are known in the polymer industry as vinyl acrylates.

The anti-blocking additive consists of polymer beads which have preferably a narrow size distribution with the mean of that distribution between 1.5 and 2 times the thickness of the adhesive layer. Typically the adhesive layer is from $2 \times 10^{-4}$ cm to $12 \times 10^{-4}$ cm thick. Thus the particles vary from mean sizes of from $3 \times 10^{-4}$ cm to $24 \times 10^{-4}$ cm, depending on the specific applied coating thickness. The concentration of the particulate material can vary from 0.1 wt % to 1.0 wt % depending on the coating thickness of the adhesive, the particle diameter, and the size distribution (the wider the size distribution, the more polymer beads required for a specific anti-blocking requirement).

The particles preferred in the practice of the present invention should possess the following characteristics: (1) at the useful concentrations in the adhesive layer (e.g., 0.1 to 1.0 weight percent, preferably 0.1 to 0.6 weight percent of the adhesive), the particles should contribute less than 0.01 optical density between 400 and 700 nm in a layer four times the thickness of the adhesive (e.g., four adhesive layers with particles therein as compared to four adhesive layers of the same thickness without particles therein), (2) as a preference only (not a requirement), the particles may have a Tg of less than the lamination temperature for the adhesive (e.g., 100° C.), (3) a preferably narrow particle size distribution (e.g., fewer than 35% preferably fewer than 25% and more preferably fewer than 20% of the particles (by number) varying by more than 50 percent from the mean average diameter) and more preferably a monodispersed particle addition is used, (4) an index of refraction close (within 0.10) to that of the adhesive is desired and within 0.01 of the adhesive or the same as the adhesive is preferred, (5) beads without sharp features (e.g. smooth surfaces) are preferred such as spherical, oblong, ovoid, or of elliptical cross-section are most preferred, but if the index of refraction of the particles and of the adhesive is the same and if the adhesive is in optical contact with the entire surface of the particle, this is not very important since the interface will not scatter light, (6) the particles should be relatively free of surface impurities that resist wetting by the solvent in the adhesive (usually surface impurities should constitute less than 10% of the surface area and preferably less than 3% of the surface area of the particles), (7) the specific gravity of the particles is preferred to be within twenty-five percent of that of the coating solution to assist in preventing separation during coating, and (8) the particles should be non-tacky to enable them to both be easily dispersed and resist agglomeration in the coating solutions.

Following the above described photomechanical production of the first color image on the substrate, for example cyan, similar sheets but containing the yellow, magenta and black color coatings are successively applied to yield a four color proof.

These and other aspects of the invention will now be illustrated in the following non-limiting examples:

EXAMPLES

A $50 \times 10^{-4}$ cm thick film of smooth-surfaced biaxially oriented polyethylene terephthalate polyester is first coated with a polyvinyl alcohol solution constituted as follows:

|  | Parts by wt. |
| --- | --- |
| Polyvinyl alcohol (available commercially as Gelvatol 20-30/Gelvatol 20:90 (3/1)) | 2.5 |
| Glycerin | 0.5 |
| Water | 97 |

A dry coating weight of 7.5 g/ sq. m provides a satisfactory release layer. The release layer surface is oven dried and then overcoated with a resin solution containing a suitable transparent pigment, in this instance a phthalocyanine pigment, e.g. "Monastral Blue BT 284-D."

The coating solution is prepared by first dispersing the pigment into 1,1,2-trichloroethane solvent, and adding polyvinylformal resin (Formvar 15/95 E), the amount of the ingredients being adjustable to yield a mix having 65 parts resin, 35 parts pigment, and 900 parts solvent. This mix is appropriately milled. The resultant mill base is then diluted by adding further solvent to yield approximately a 3 percent solids. This pigmented-resin coating solution or dispersion is applied over the dried release layer at a dry coating weight of about 200–700 milligrams per sq. m. The coated sheet construction is oven dried as before to evaporate the solvent.

The polyvinyl formal coated side of the sheet is then primed by a corona discharge treatment, sufficient to render the surface of the film water-wettable.

A solution of light-sensitive diazo resin or equivalent is then coated over the primed surface of the sheet. A preferred diazo resin is the condensation product of p-diazodiphenylamine and formaldehyde, prepared, for example, in accordance with the method described in U.S. Pat. No. 2,714,066. A solution of the pure diazo resin, for example, 4 parts resin dissolved in 48 parts water and 12 parts methanol, is made up.

The preparations of the light-sensitive diazo resin just described may be applied on the primed polyvinylformal layer by roll-coating or by dipping the sheet into the solution of the resin. It is preferred that the diazo coating be thin, a residue of about 60–80 milligrams of the diazo resin per square meter of the area being satisfactory, although the precise amount is not particularly critical with amounts of 30–500 mg/sq. m being useful. The sheet is then air dried at room temperature, or at slightly elevated temperatures if desired. A barrier is applied over the diazo layer, for example, by coating a two percent weight solution in methyl ethyl ketone of a 3:1 weight ratio of polyacrylate ("Elvacite 2044") and polyvinyl chloride-acetate copolymer ("Vinylite VAGH") at a dry coating weight of 1.6 g/sq. m (generally a coating weight of 1-4 g /sq. m is preferred).

A clear colorless thermally laminable adhesive composition containing polymeric anti-blocking beads given in the table below is coated on the acrylate surface at the dry coating weight given in the table below. In this form the light-sensitive sheet can then be converted into standard sizes, packed in suitable light-proof containers and shipped in commerce. The adhesive - polymeric beads composition may be coated in much greater quantities, a general range being from about 1 to 12 g/sq. m.

From the data in the table, it may be seen that even in the lowest concentration of particulates the haze is too high in the silica materials, with the exception of the 0.012 micron silica which did not prevent blocking. In contrast, even at 0.1 wt %, the blocking is completely eliminated when 10 micron PMMA beads are used in a 3.5 micron thick adhesive layer. When the particle diameters are only slightly larger than the layer thickness, some benefit from blocking is observed, but a higher concentration of particles is required to reduce the tendency to block. If the particles are smaller than the layer thickness, blocking occurs.

TABLE 1

| Particulate Materials | Adhesive Layer Thickness (Microns) | Particle Diameter (Microns) | Size Distribution | Wt. % of Adhesive | Blocking | Haze |
| --- | --- | --- | --- | --- | --- | --- |
| Silcron G-600 | 3.5 | 4.7 | Wide | 0.08 | 4 | 2.47 |
|  |  |  |  | 0.40 | 0 | 2.77 |
|  |  |  |  | 0.68 | 0 | 2.22 |
| Silcron G-550 | 3.5 | 4.5 | Wide | 0.68 | 0 | 1.82 |
| Gasil 23F | 3.5 | 10.0 | Wide | 0.68 | 1 | 2.66 |
| Sipernat 5 | 3.5 | 5.0 | Wide | 0.68 | 2 | 2.45 |
| Aerosil | 3.5 | 0.012 | Medium | 0.68 | 6 | 0.96 |
| MA-10 PMMA | 3.5 | 10 | Medium | 0.10 | 0 | 1.10 |
|  |  |  |  | 0.20 | 0 | 1.03 |
|  |  |  |  | 0.40 | 0 | 1.16 |
|  |  |  |  | 0.60 | 0 | 1.23 |
|  |  |  |  | 2.00 | 0 | 1.60 |
|  | 7.0 | 10 |  | 0.10 | 3 | 1.05 |
|  |  |  |  | 2.00 | 0 | 1.81 |
| MA-6 PMMA | 3.5 | 6 | Medium | 0.20 | 4 | 1.05 |
|  |  |  |  | 0.40 | 4 | 1.05 |
|  |  |  |  | 0.60 | 1 | 1.05 |
|  | 7.0 | 6 |  | 0.43 | 6 | 1.05 |
|  |  |  |  | 0.57 | 6 | 1.05 |
|  |  |  |  | 1.00 | 6 | 1.05 |
| MA-4 PMMA | 3.5 | 4 | Medium | 0.68 | 2 | 1.07 |
| Polybead | 3.5 | 5.84 | Very Narrow | 0.10 | 0 | 1.16 |
|  | 7.0 | 9.33 | Very Narrow | 0.10 | 0 | 1.26 |
| Control | 3.5 | — | — | 0.00 | 6 | 1.01 |
|  | 7.0 | — | — | 0.00 | 6.0 | 1.07 |

EXAMPLES

The following examples evaluate the effect of the size of the particulates and their concentration on the practice of the present invention.

Blocking test conditions are as follows: Four sheets of material to be tested are cut to dimensions 12 inches (30.2 cm) by 5 inches (13 om) and stacked with the adhesive side of one sheet in contact with the back (uncoated) side of the next. A flat, smooth aluminum plate of the same dimensions is placed over the material. The aluminum plate is of uniform thickness and weighs 526 grams; this results in a pressure of 1.35 g/sq. cm on the material during the test. (This pressure was chosen to correspond with the pressure at the bottom of a stack of 160 sheets of boxed proofing material). The material is then exposed to 60° C. for 24 hours. On cooling, the material sheets are separated. Any tendency to cling together or disrupt any coating layer is regarded a blocking and is graded visually from 0 to 6, with 0 being the case with no blocking and 6 being completely blocked such that the layers are completely disrupted on separation. Some disruption of the layer is indicated by any values of 4 or higher.

TABLE 2

Example with Adhesive Layer Only On Polyester Substrate

| | | | | | | |
| --- | --- | --- | --- | --- | --- | --- |
| Polybead | 3.5 | 5.84 | Very Narrow | 0.10 | 0 | 0.86 |
|  | 7.0 | 9.33 | Very Narrow | 0.10 | 0 | 1.00 |
| Control | 3.5 | — | — | 0.00 | 6 | 0.71 |
|  | 7.0 | — | — | 0.00 | 6 | 0.81 |

MA PMMA - 3M, Fine Chemicals Mfg. Div., Rochester, NY
Silcron - SCM Corp., Baltimore, Maryland
Gasil - Joseph Crossfield & Con, Ltd., Warrington, UK
Sipernat - North American Silica Co., Degussa Corp. Teterboro, NY
Aerosil - Degussa, Frankfurt, W. Germany
Polybead - Polysciences, Inc., Warrington, PA
Haze is measured with the Gardner/Neotec Haze Meter Model # XL - 211 in transmission mode prior to lamination. Acceptable haze values for 3.5 micron thick adhesive layers range from 0.79 to 1.23; those for 7.0 micron thick range from 0.88 to 1.26.

In the foregoing illustration, a cyan color proofing sheet is described. The companion magenta, yellow, and black structures (which, together with the cyan sheet, constitute a complete four-color proofing system) are similarly prepared employing the same polyvinylformal resin coating, but incorporating appropriately colored pigments, for example, "Watchung Red RT 761-D,""Benzidine Yellow YT 564-D," and Cabot "Regal 300 R" carbon black. Pigments are selected and pigment/resin ratios established generally to provide the same color-density as would result from the printing ink of corresponding color being used on the job being proofed. The sheets can be stored in sensitized condition, and then used weeks or months later as successfully as immediately following manufacture. In using the sheets in producing a color proof composite, any desired substrate can be used.

In preparing a color proof composite, the colors are processed individually and consecutively. A sheet of the color represented, for example yellow is prepared for processing by laminating the color sheet to the backing sheet. Pressure applied by conventional laminating apparatus with a heated roller is sufficient to achieve lamination through the thermally laminable adhesive. Following lamination the support sheet of polyethylene terephthalate is stripped away. The light sensitive layer now on the backing sheet is contact exposed through the corresponding color separation negative.

The light-imaged backing is then physically developed with a solution of normal propanol-water in a 1:1 volume ratio, brushing and wiping with a soft cloth pad to remove the pigmented resin and unexposed sensitizer layers from the non-imaged (unexposed) areas to leave the latter clear and colorless. Thereby an image is defined, faithfully representing the reproduction and full color range which would result if the complete platemaking and printing operation (using appropriately matched ink), were carried through with that color separation negative.

A sheet of the second color to be proofed, preferably magenta, is prepared in the same way by laminating it to the yellow imaged backing sheet. The corresponding color separation negative must now be positioned in exact register with the yellow image. This is commonly provided for by a preregistration of all the separation negatives and the backing sheet by a system of register marks or punches. The light-sensitive layer now on the yellow-imaged backing sheet is exposed and processed, as for the first color. The remaining cyan and black images are thereafter added, in turn, thus faithfully reproducing the four color result which would occur in printing, were printing plates employed prepared from the same color separation negatives.

Certain necessary relationships exist between the elements of the construction just described. Adhesive relationships must be such that, after adhesive lamination to the backing sheet, the release layer will allow stripping away the film carrier without disrupting the adhesive bond. Failure must not occur at either the adhesive-backing sheet or adhesive-barrier layer bonds. While it is not particularly critical whether release occurs between carrier-layer-release layer or release layer-color layer, release is generally less efficient between two in situ formed layers, resulting in some what more likely release between carrier layer and release layer. In this event, it is of importance that the release layer be transparent.

With regard to the selection of the resin of the color coat and to the solution used to develop the image, reference is again made to U.S. Pat. No. 3,136,637, where numerous organophilic hydrophobic water-insoluble solvent-softenable resinous polymers are disclosed, along with suitable developing solutions. It is therein discussed that upon light-exposure of the structure, a firm in situ bond is formed between the resin and the diazo in the light-struck areas, while permitting the resin to be removed upon light rubbing treatment with the appropriate developing solution. The present invention avails itself of the principles.

In as much as the light-sensitive layer is extremely thin and discontinuous, the color-coat and the barrier layer contact one another in the structure and their inter-relation is important. The bond formed between them (or any intermixing occurring at the interface) must not be such as to prevent the color-coat from being removed in the non-light struck areas during development. As indicated above, whatever natural bond exists is strengthened in situ upon light reaction of the diazo to give a strong bond preventing removal in those areas upon development. It has been found that the desired relation is present where at least a degree of physical incompatability exists between the resins comprising the color and barrier layer.

During the coating operations, best results are obtained where a later applied layer is cast from a solvent which does not dissolve prior layers.

In the preceding example, the color-coating and the diazo resin were applied in separate steps from different solvents.

We claim:

1. A presensitized color-proofing sheet comprising a carrier sheet having a release surface, a continuous color coating of pigmented organophilic hydrophobic water-insoluble resinous polymer softenable and/or partially dissolvable in a solvent developing medium, said color coating being in intimate clinging engagement with but not adhesively bonded to said release surface, a light sensitive diazo resin soluble in said solvent developing medium directly associated with said color coating, said direct association being at least one of the following:
   (a) the incorporation of said diazo resin in the color coating to form a single layer; and
   (b) the incorporation of said diazo resin in a layer separate from but contiguous to the color coating layer, a continuous, water-insoluble, transparent, colorless barrier layer bonded on one surface over said color coating and said diazo resin, said barrier layer being insoluble in said solvent developing medium, the diazo resin becoming insolubilized, and firmly bonding said color layer to said barrier layer in the light-struck areas upon light exposure of said sheet, the color layer and diazo resin being readily removable from said barrier layer in areas not light exposed and over said barrier layer a thermally-laminable adhesive layer comprising a layer of at least one acrylic polymer or copolymer which is laminable at a temperature between 100° and 150° C. at a pressure of 0.29 kg/sq. cm in 10 seconds, non-tacky at room temperature, will not discolor or alter the reflectance optical density by as much as 0.05 optical density units when exposed to sufficient ultraviolet radiation having a majority of the radiation distributed over the range of 350 and 450 nm to enable an image to be developed from activation of the diazo resin and have no ingredients capable of migrating through said barrier layer and desensitizing said diazo resin, discoloring said pigment, or distorting the optical properties of the other layers and containing narrow size distribution particulate organic polymer beads whose mean diameter is from 1.1 to 3 times the thickness of the said adhesive layer in a weight concentration range of 0.05 to 2% of the weight of adhesive.

2. The sheet of claim 1 wherein said organic polymer beads comprise a polymethyl methacrylate polymer or copolymer.

3. The sheet of claim 1 wherein said organic polymer bead comprises polystyrene.

4. The sheet of claim 1 wherein said beads have a narrow size distribution.

5. The sheet of claim 1 wherein said beads are monodispersed.

6. The sheet of claim 1 wherein said beads have an index of refraction which is within 0.1 of the index of refraction of the adhesive.

7. The sheet of claim 2 wherein said beads have an index of refraction which is within 0.1 of the index of refraction of the adhesive.

8. The sheet of claim 3 wherein said beads have an index of refraction which is within 0.1 of the index of refraction of the adhesive.

9. The sheet of claim 4 wherein said beads have an index of refraction which is within 0.1 of the index of refraction of the adhesive.

10. The sheet of claim 5 wherein said beads have an index of refraction which is within 0.1 of the index of refraction of the adhesive.

11. The sheet of claim 1 wherein said particles have smooth surfaces.

12. The sheet of claim 1 wherein said particles are spherical, elliptical, or ovoid.

13. The sheet of claim 2 wherein said particles are spherical, elliptical, or ovoid.

14. The sheet of claim 4 wherein said particles are spherical, elliptical, or ovoid.

15. The sheet of claim 6 wherein said particles are spherical, elliptical, or ovoid.

16. The sheet of claim 7 wherein said particles are spherical, elliptical, or ovoid.

17. The sheet of claim 8 wherein said particles are spherical, elliptical, or ovoid.

18. The sheet of claim 9 wherein said particles are spherical, elliptical, or ovoid.

* * * * *